United States Patent [19]

Uehara

[11] Patent Number: 5,767,706
[45] Date of Patent: Jun. 16, 1998

[54] RATE GENERATOR

[75] Inventor: Takafumi Uehara, Tokyo, Japan

[73] Assignee: Ando Electric Co., Ltd., Tokyo, Japan

[21] Appl. No.: 721,054

[22] Filed: Sep. 26, 1996

[30] Foreign Application Priority Data

Sep. 27, 1995 [JP] Japan ................... 7-273425
Dec. 22, 1995 [JP] Japan ................... 7-350580

[51] Int. Cl.$^6$ ................... H03K 7/08; H03K 9/06
[52] U.S. Cl. ................... 327/113; 327/116; 327/115
[58] Field of Search .............. 331/113–118; 341/61;
375/225; 370/465, 503

[56] References Cited

U.S. PATENT DOCUMENTS 3,735,049  5/1973  Buchner et al. ............... 179/15 AQ Primary Examiner—Timothy P. Callahan
Assistant Examiner—An T. Luu
Attorney, Agent, or Firm—Finnegan, Henderson, Farabow, Garrett & Dunner, L.L.P.

[57] ABSTRACT

The object of the present invention is to offer a rate generator which is capable of generating rate signals of arbitrary time intervals over a wide range, from low speeds to high speeds. An N-bit (wherein N is a natural number) counter 1 counts up according to a clock signal 31. An adder 16 pairs off and adds consecutive rate data 32. An adder 17 pairs off and adds rate data 32 which has been shifted by a single step. An adder 18 sequentially adds the addition results of the adder 16. An adder 19 sequentially adds the addition results of the adder 17. A selector 4 alternately selects the addition results of the adder 18 and the addition results of the adder 19. A correspondence circuit 2 receives the output of the counter 1 as a first input and the output of the selector 4 as a second input, and detects matches between the two inputs. A pulse generation circuit 3 is inputted with the output of the correspondence circuit 2 and a clock signal 31, and outputs a rate signal 33.

19 Claims, 6 Drawing Sheets

RATE GENERATOR

BACKGROUND OF THE INVENTION

1. Technical Field of the Invention

The present invention relates to rate generators, more specifically to rate generators which are used for IC tests and the like, which are capable of being set to arbitrary time intervals depending on rate data.

2. Background Art

FIG. 5 shows a conventional rate generator used in IC tests and the like. As shown in FIG. 5, the conventional rate generator is composed of a counter 41, a correspondence circuit 42, a pulse generation circuit 43, D-type flip-flops 44 and 46, and an adder 45.

The counter 41 is inputted with a clock signal 31, according to which the counter 41 counts up. The adder 45 is inputted with rate data which is latched by means of a rate signal 35 at the D-type flip-flop 44, and adds this input to the previous addition result (that is, the output of the D-type flip-flop 46) of the adder 45. At the D-type flip-flop 46, the output of the adder 45 is inputted to the data terminal, while the rate signal 33 is inputted to the clock terminal, and the output is outputted to the adder 45 and the correspondence circuit 42.

The correspondence circuit 42 compares the N-bit output of the counter 41 with the N-bit output of the D-type flip-flop 46, and outputs a correspondence signal to the pulse generation circuit 43 when these N-bit values are equal. The pulse generation circuit 43 is inputted with the output of the correspondence circuit 42 and the clock signal 31, and generates a single pulse timed to the clock signal 31 when a correspondence signal is inputted. According to this rate generator, it is possible to obtain a desired rate signal by generating a pulse each time the output value of the counter 41 and the output value of the adder 45 match.

FIG. 6 is a timing chart for the conventional art of FIG. 5. In FIG. 6, A is a waveform diagram for the clock signal 31, B is a waveform diagram for the output of the counter 41, C is a waveform diagram for the output of the D-type flip-flop 44, D is a waveform diagram for the output of the D-type flip-flop 46, and E is a waveform diagram for the rate signal 35.

As shown in FIG. 6, if the period of the clock signal 31 is taken to be T, then the counter 41 counts up with a period of T as shown in diagram B of FIG. 6. Below, the case is considered wherein data are given in the order "2", "3", "4", ... for the rate data 32.

The adder 45 sequentially adds the outputs of the D-type flip-flop 44, so that the output of the D-type flip-flop 46 changes as shown in diagram D of FIG. 6 from "1"+"2"="3" to "3"+"3"="6" to "6"+"4"="10" to "10"+"5"="15."

As a result, the inputs at one end of the correspondence circuit 42 are "1", "3", "6", "10" and "15", so that when the counter 41 counts up to the outputs "1", "3", "6", "10" and "15", the input of the correspondence circuit 42 matches and the pulse generation circuit 43 generates a pulse as shown in diagram E of FIG. 6 timed by the clock signal of diagram A of FIG. 6. In this way, it is possible to obtain a rate signal 35 having time intervals of 2T, 3T, 4T, and so on.

With the advent of high-speed IC's in recent years, rate generators used in IC testers have come to require the setting of rate signals over a wide range of time intervals from low speeds to high speeds. However, when rate signals are required to be set over a wide range of time intervals with the conventional art shown in FIG. 5, the bit width N of the rate data becomes large and the time required for performing the addition becomes large, so as to present a problem in that it becomes difficult to perform an addition within the rate time when a high-speed rate signal is generated.

SUMMARY OF THE INVENTION

The present invention has the object of offering a rate generator which is capable of generating rate signals of arbitrary time intervals over a wide range, from low speeds to high speeds.

This invention offers a rate generator which generates rate signals of desired time intervals depending on rate data, comprising counting means for counting inputted clock signals and outputting count values; first addition means for pairing off and adding consecutive rate data; second addition means for pairing off and adding the rate data shifted by a single step; third addition means for sequentially adding addition results of the first addition means with the previous addition results; fourth addition means for sequentially adding addition result of the second addition means with the previous addition results; selection means for alternately selecting addition results of the third addition means and addition results of the fourth addition means; correspondence detection means for receiving the output of the counting means as a first input and the output of the selection means as a second input, and detecting when the two inputs are equal; and pulse generation means for receiving the output of the correspondence detection means and a clock signal as inputs, and outputting a rate signal.

According to the present invention, it is possible to generate rate signals of arbitrary intervals over a wide range, from low speeds to high speeds, due to a structure wherein the addition of rate data are performed within the time span of two rates.

Next, the preferred embodiments of the rate generator according to the present invention will be explained with reference to the drawings.

FIRST EMBODIMENT

Figure 1:
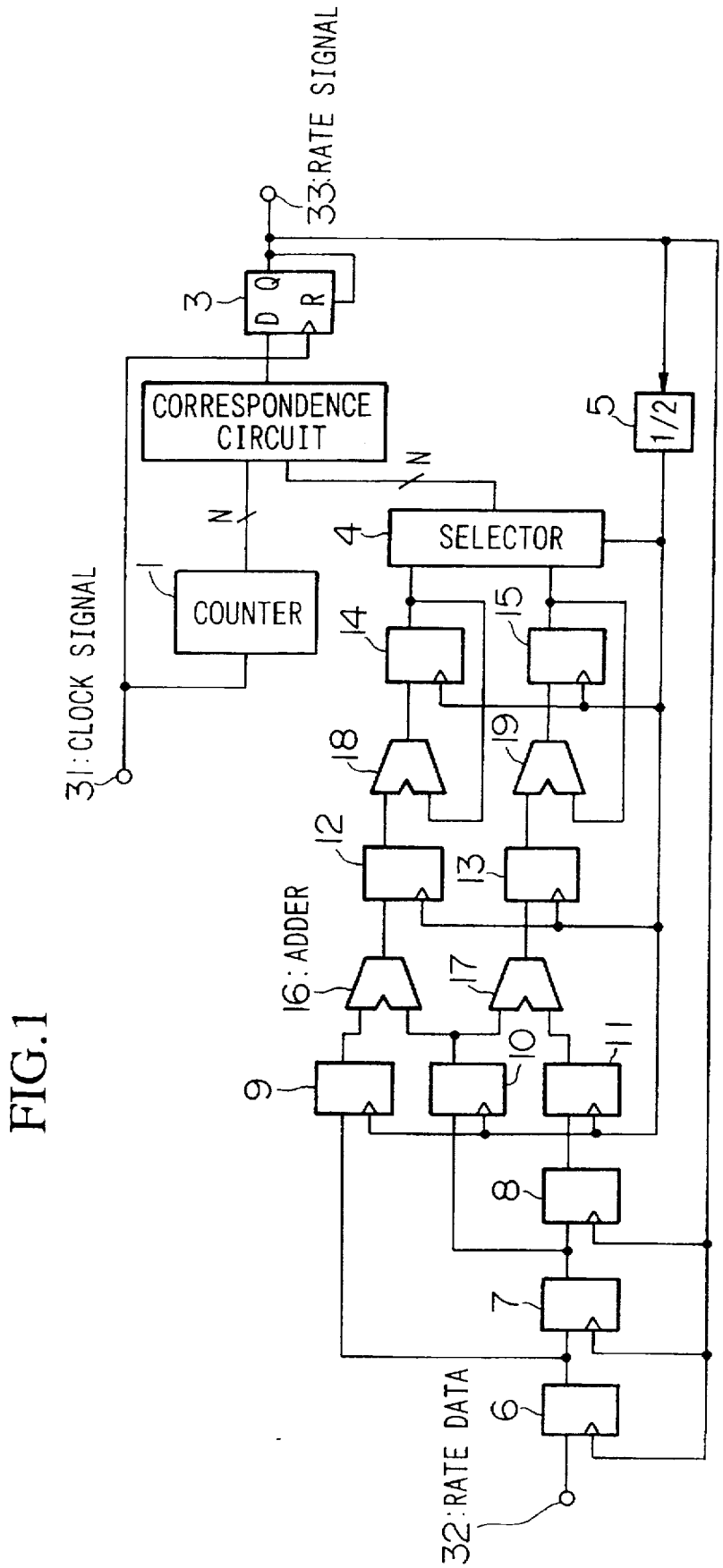
FIG. 1 is a block diagram showing a structural example of a rate generator according to the first embodiment of the present invention.

FIG. 1 is a block diagram showing an embodiment of the rate generator according to the present invention. The rate generator of the present embodiment is a circuit used in IC testers and the like, which generates rate signals having arbitrary time intervals from low speeds to high speeds in response to rate data. In FIG. 1, reference numeral 1 denotes a counter, reference numeral 2 denotes a correspondence circuit, reference numeral 3 denotes a pulse generation circuit formed by D-type flip-flops, reference numeral 4 denotes a selector, reference numeral 5 denotes a frequency divider, reference numerals 6–15 denote D-type flip-flops, and reference numerals 16–19 denote adders.

With reference to FIG. 1, when the clock signal 31 is inputted to the counter 1, the counter 1 counts in accordance with this clock, and sends the results to the correspondence circuit 2 as N-bit data (wherein N is a natural number). The N-bit rate data 32 are inputted to the data input terminal of the three-stage shift register composed of the D-type flip-flops 6–8, and stored in the D-type flip-flops 6–8 timed with the rate signal 33.

The output of the D-type flip-flop 6 is inputted to the data input terminal of the D-type flip-flop 9, and latched by the D-type flip-flop 9 by means of a signal wherein the rate signal 33 has been halved by the frequency divider 5. In the same manner, the output of the D-type flip-flop 7 is inputted to the data input terminal of the D-type flip-flop 10, and latched by the D-type flip-flop 10 by means of a signal wherein the rate signal 33 has been halved by the frequency divider 5. Likewise, the output of the D-type flip-flop 8 is inputted to the data input terminal of the D-type flip-flop 11, and latched by the D-type flip-flop 11 by means of a signal wherein the rate signal 33 has been halved by the frequency divider 5.

The output of the D-type flip-flop 9 and the output of the D-type flip-flop 10 are added by the adder 16. In the same manner, the output of the D-type flip-flop 10 and the output of the D-type flop-flop 11 are added by the adder 17.

The output of the adder 16 is inputted to the data input terminal of the D-type flip-flop 12, and latched by the D-type flip-flop 12 by means of a signal wherein the rate signal 33 has been halved by the frequency divider 5. Likewise, the output of the adder 17 is inputted to the data input terminal of the D-type flip-flop 13, and latched by the D-type flip-flop 13 by means of a signal wherein the rate signal 33 has been halved by the frequency divider 5.

The output of the D-type flip-flop 12 is inputted to the adder 18. The adder 18 adds this input with the previous addition result of the adder 18 (that is, the output of the D-type flip-flop 14). Likewise, the output of the D-type flip-flop 13 is inputted to the adder 19. The adder 19 adds this input with the previous addition result of the adder 19 (that is, the output of the D-type flip-flop 15).

The output of the adder 18 is inputted to the data input terminal of the D-type flip-flop 14, and latched by the D-type flip-flop 14 by means of a signal wherein the rate signal 33 has been halved by the frequency divider 5. Likewise, the output of the adder 19 is inputted to the data input terminal of the D-type flip-flop 15, and is latched by the D-type flip-flop 15 by means of a signal wherein the rate signal 33 has been halved by the frequency divider 5.

The selector 4 selects either the output of the D-type flip-flop 14 or the output of the D-type flip-flop 15 depending on a signal wherein the rate signal 33 has been divided by the frequency divider 5, and sends it to the correspondence circuit 2.

The correspondence circuit 2 compares the N-bit output of the counter 1 with the N-bit output of the selector 4, and outputs a correspondence signal to the pulse generation circuit 3 when these outputs match. The pulse generation circuit 3 is inputted with the output of the correspondence circuit 2 and the clock signal 31, and generates a single pulse timed with the clock signal 31 when the correspondence is inputted.

In this way, a desired rate signal can be obtained by generating a pulse each time the output value of the counter 1 matches with the output value of the selector 4.

Figure 2:
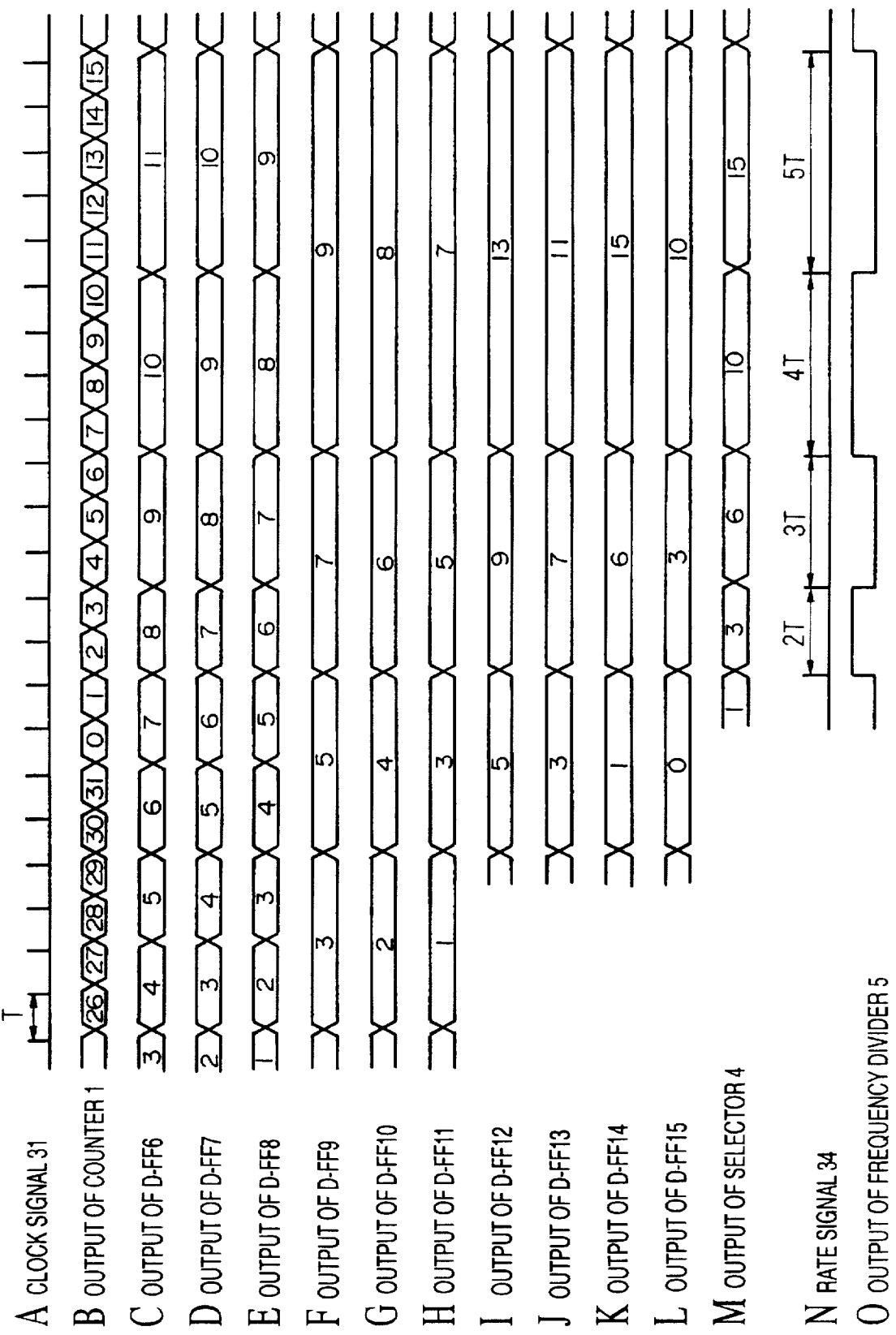
FIG. 2 is a timing chart showing an operational example of the rate generator shown in FIG. 1.

FIG. 2 is a timing chart for the rate generator according to the present embodiment shown in FIG. 1. FIG. 2 shows the case wherein N=5 in FIG. 1. In FIG. 2, A is a waveform diagram for the clock signal 31, B is a waveform diagram for the output of the counter 1, C–L are waveform diagrams for the outputs of the D-type flip-flops 6–15, M is a waveform diagram for the output of the selector 4, N is a waveform diagram for the rate signal 33, and O is a waveform diagram for the output of the frequency divider 5.

When the clock signal 31 has a period T as shown in diagram A of FIG. 2, the counter 1 counts up as shown in diagram B of FIG. 2. With the present embodiment, the rate data 32 are given in the order "2", "3", "4", and so on. The rate data 32 are inputted to a three-stage shift register composed of the D-type flip-flops 6–8 of FIG. 1, and the output of each D-type flip-flop 6–8 is as shown in diagrams C–E of FIG. 2.

The D-type flip-flop 9 of FIG. 1 latches every other output of the D-type flip-flop 6 according to a signal (see diagram O of FIG. 2) wherein the rate signal 33 has been divided by the frequency divider 5. As a result, the output of the D-type flip-flop 9 becomes the waveform of diagram F of FIG. 2. Likewise, the D-type flip-flop 10 of FIG. 1 latches every other output of the D-type flip-flop 7 according to the waveform of diagram O of FIG. 2. As a result, the output of the D-type flip-flop 7 becomes the waveform of diagram G of FIG. 2. Similarly, the D-type flip-flop 11 of FIG. 1 latches every other output of the D-type flip-flop 8 according to the waveform of diagram O of FIG. 2. As a result, the output of the D-type flip-flop 11 becomes the waveform of diagram H of FIG. 2.

The adder 16 adds the output of the D-type flip-flop 9 with the output of the D-type flip-flop 10, so that the output of the D-type flip-flop 12 changes as "3"+"2"="5", "5"+"4"="9", "7"+"6"="13", as shown in diagram I of FIG. 2. Likewise, the adder 17 adds the output of the D-type flip-flop 10 with the output of the D-type flip-flop 11, so that the output of the D-type flip-flop 13 changes as "2"+"1"="3", "4"+"3"="7", "6"+"5"="11", as shown in diagram J of FIG. 2.

The adder 18 sequentially adds the outputs of the D-type flip-flop 12, so that if the initial value for the output of the D-type flip-flop 14 is "1", then the output changes as "1"+"5"="6", "6"+"9"="15", as shown in diagram K of FIG. 2. Likewise, the adder 19 sequentially adds the outputs of the D-type flip-flop 13, so that if the initial value for the output of the D-type flip-flop 15 is "0", then the output changes as "0"+"3"="3", "3"+"7"="10", as shown in diagram L of FIG. 2.

The selector 4 alternately selects the output of the D-type flip-flop 14 and the output of the D-type flip-flop 15 according to the value of the frequency divider 5, so as to output the waveform shown in diagram M of FIG. 2. As a result, one of the inputs of the correspondence circuit 2 becomes "1", "3", "6", "10", "15", so that when the counter 1 counts up to reach the count values of "1", "3", "6", "10", "15", the two input signals of the correspondence circuit 2 match.

When the two input signals of the correspondence circuit 2 match, the pulse generation circuit 3 is inputted with a correspondence signal from the correspondence circuit 2, and generates pulses as shown in diagram N of FIG. 2 according to the clock signal of diagram A of FIG. 2. In this manner, it is possible to obtain rate signals 33 having time intervals of 2T, 3T, 4T, and so on.

SECOND EMBODIMENT

Figure 3:
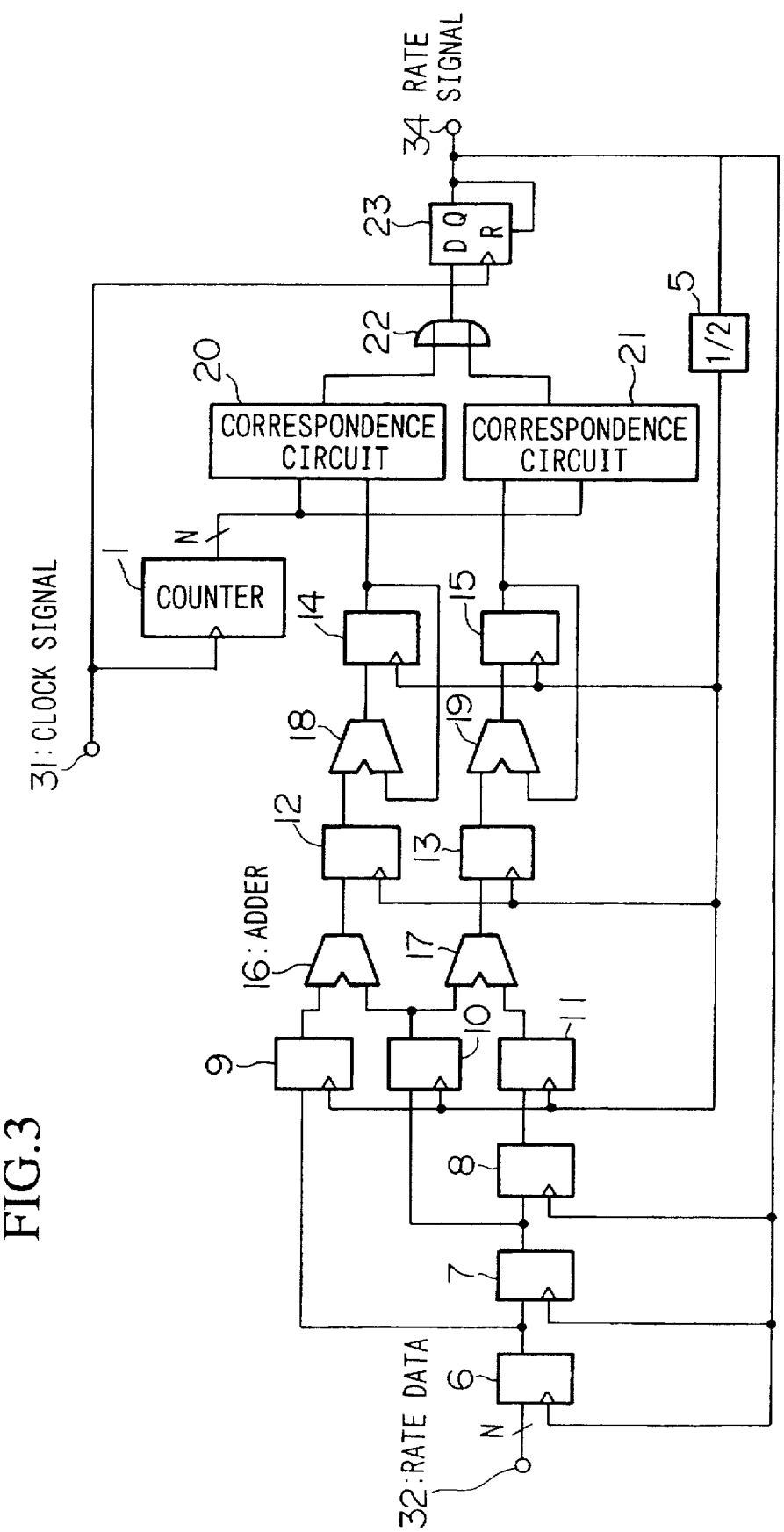
FIG. 3 is a block diagram showing a structural example of a rate generator according to a second embodiment of the present invention.

FIG. 3 is a block diagram showing an embodiment of the rate generator according to the present invention. The rate generator of the present embodiment is a circuit used in IC testers and the like, which is capable of generating rate signals having arbitrary time intervals from low speeds to high speeds in response to rate data. In FIG. 3, reference numeral 1 denotes a counter, reference numerals 20 and 21 denote correspondence circuits, reference numeral 22 denotes an OR gate, reference numeral 23 denotes a pulse generation circuit formed by D-type flip-flops, reference numerals 6–15 denote D-type flip-flops, reference numerals 16–19 denote adders, and reference numeral 5 denotes a frequency divider.

With reference to FIG. 3, when the clock signal 31 is inputted to the counter 1, the counter 1 counts in accordance with this clock, and sends the results to the correspondence circuits 20 and 21 as N-bit data (wherein N is a natural number). The N-bit rate data 32 are inputted to the data input terminal of the three-stage shift-register composed of the D-type flip-flops 6–8, and stored in the D-type flip-flops 6–8 timed with the rate signal 34.

The output of the D-type flip-flop 6 is inputted to the data input terminal of the D-type flip-flop 9; and latched by the D-type flip-flop 9 by means of a signal wherein the rate signal 34 has been halved by the frequency divider 5. In the same manner, the output of the D-type flip-flop 7 is inputted to the data input terminal of the D-type flip-flop 10, and latched by the D-type flip-flop 10 by means of a signal wherein the rate signal 34 has been halved by the frequency divider 5. Likewise, the output of the D-type flip-flop 8 is inputted to the data input terminal of the D-type flip-flop 11, and latched by the D-type flip-flop 11 by means of a signal wherein the rate signal 34 has been halved by the frequency divider 5.

The output of the D-type flip-flop 9 and the output of the D-type flip-flop 10 are added by the adder 16. In the same manner, the output of the D-type flip-flop 10 and the output of the D-type flop-flop 11 are added by the adder 17.

The output of the adder 16 is inputted to the data input terminal of the D-type flip-flop 12, and latched by the D-type flip-flop 12 by means of a signal wherein the rate signal 34 has been halved by the frequency divider 5. Likewise, the output of the adder 17 is inputted to the data input terminal of the D-type flip-flop 13, and latched by the D-type flip-flop 13 by means of a signal wherein the rate signal 34 has been halved by the frequency divider 5.

The output of the D-type flip-flop 12 is inputted to the adder 18. The adder 18 adds this input with the previous addition result of the adder 18 (that is, the output of the D-type flip-flop 14). Likewise, the output of the D-type flip-flop 13 is inputted to the adder 19. The adder 19 adds this input with the previous addition result of the adder 19 (that is, the output of the D-type flip-flop 15).

The output of the adder 18 is inputted to the data input terminal of the D-type flip-flop 14, and latched by the D-type flip-flop 14 by means of a signal wherein the rate signal 34 has been halved by the frequency divider 5. Likewise, the output of the adder 19 is inputted to the data input terminal of the D-type flip-flop 15, and is latched by the D-type flip-flop 15 by means of a signal wherein the rate signal 34 has been halved by the frequency divider 5.

The correspondence circuit 20 compares the N-bit output of the counter 1 with the N-bit output of the D-type flip-flop 14, and outputs a correspondence signal to the OR gate 22 when these outputs match. Likewise, the correspondence circuit 21 compares the N-bit output of the counter 1 with the N-bit output of the D-type flip-flop 15, and outputs a correspondence signal to the OR gate 22 when these outputs match.

The OR gate 22 outputs a correspondence signal, wherein the output of the correspondence circuit 20 and the output of the correspondence signal 21 have been OR-processed, to the pulse generation circuit 23. The pulse generation circuit 23 is inputted with the output of the OR gate 22 and the clock signal 31, and outputs a single pulse timed with the clock signal 31 when the correspondence circuit has been inputted.

In this way, a desired rate signal can be obtained by generating a pulse each time the output value of the counter 1 matches with the output value of the D-type flip-flop 14 or the D-type flip-flop 15.

Figure 4:
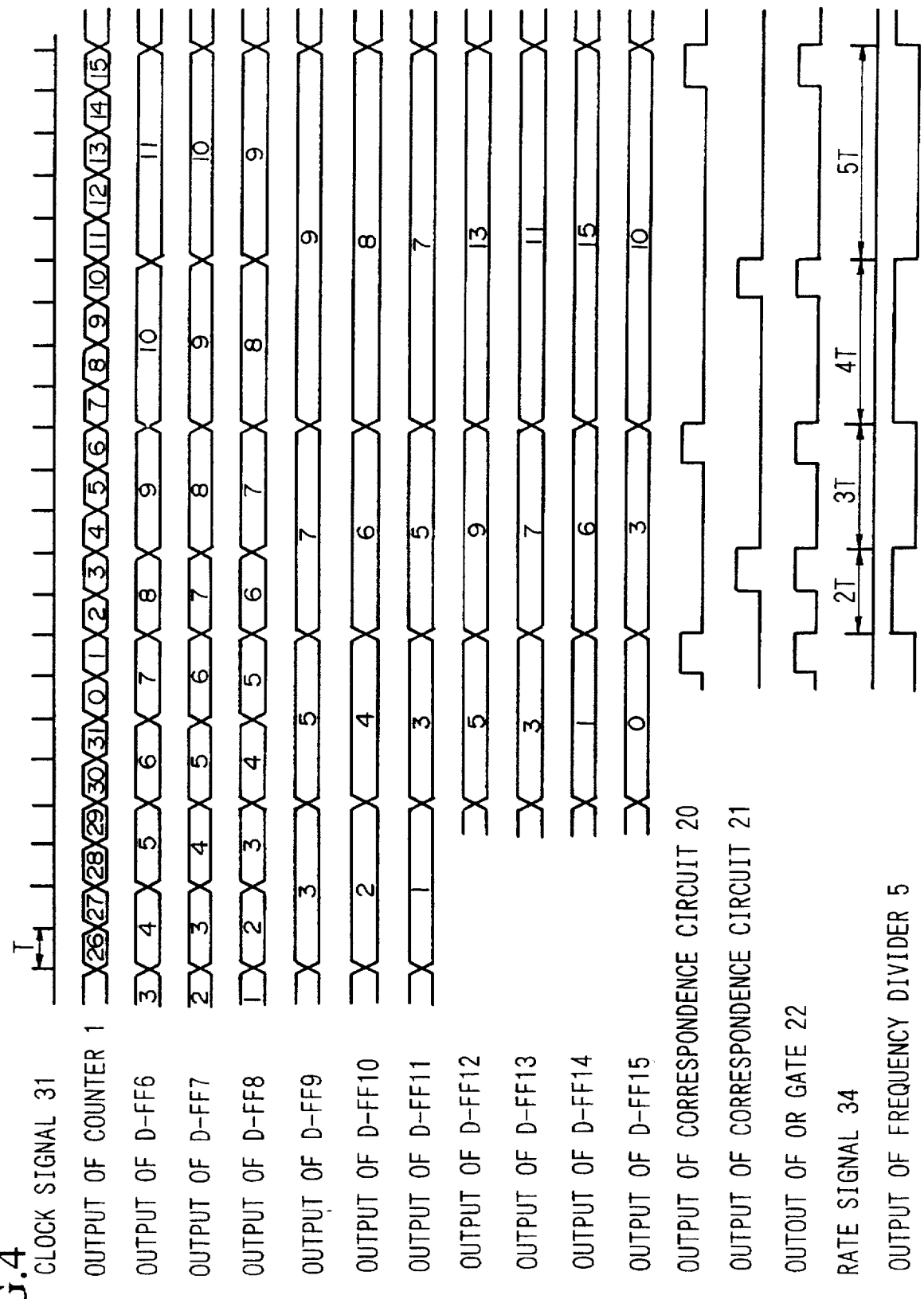
FIG. 4 is a timing chart showing an operational example of the rate generator shown in FIG. 3.
Figure 5:
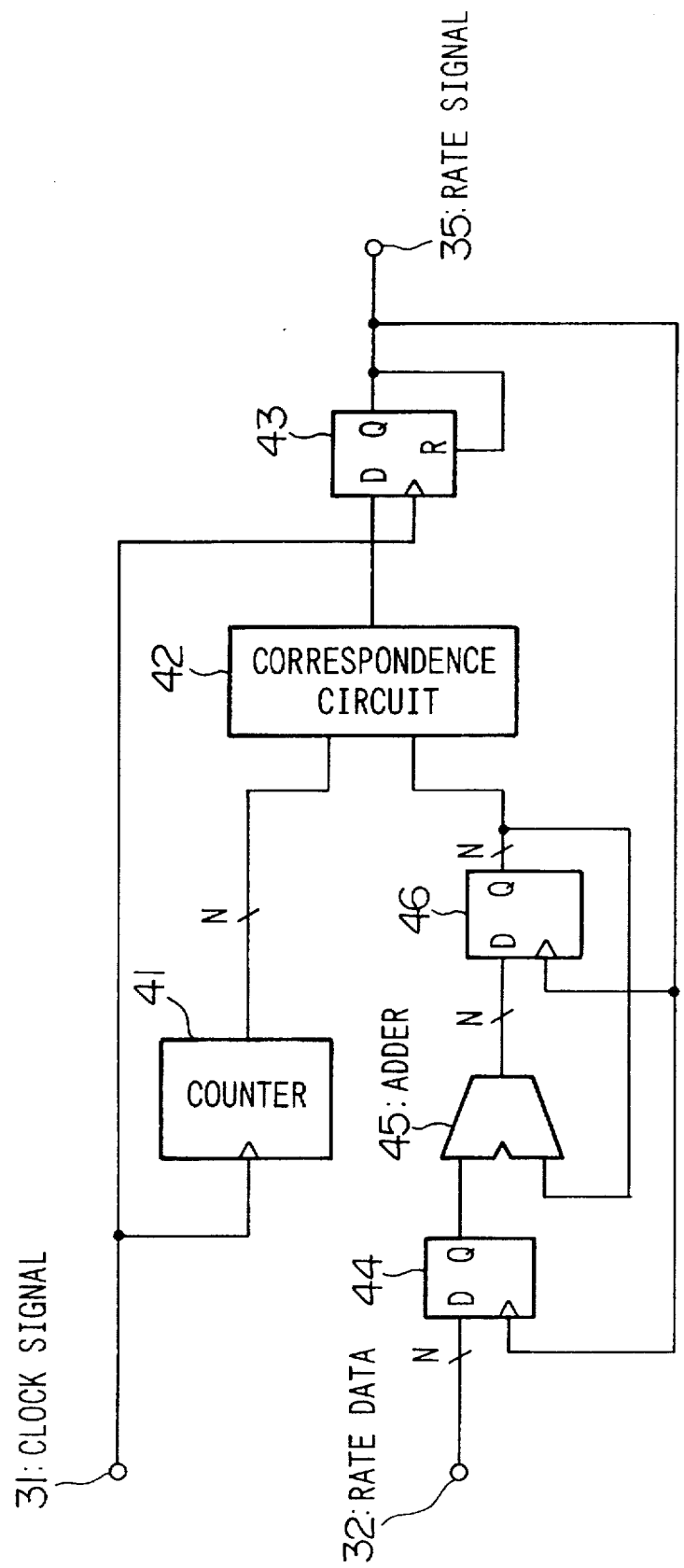
FIG. 5 is a block diagram showing a structural example of a conventional rate generator.
Figure 6:
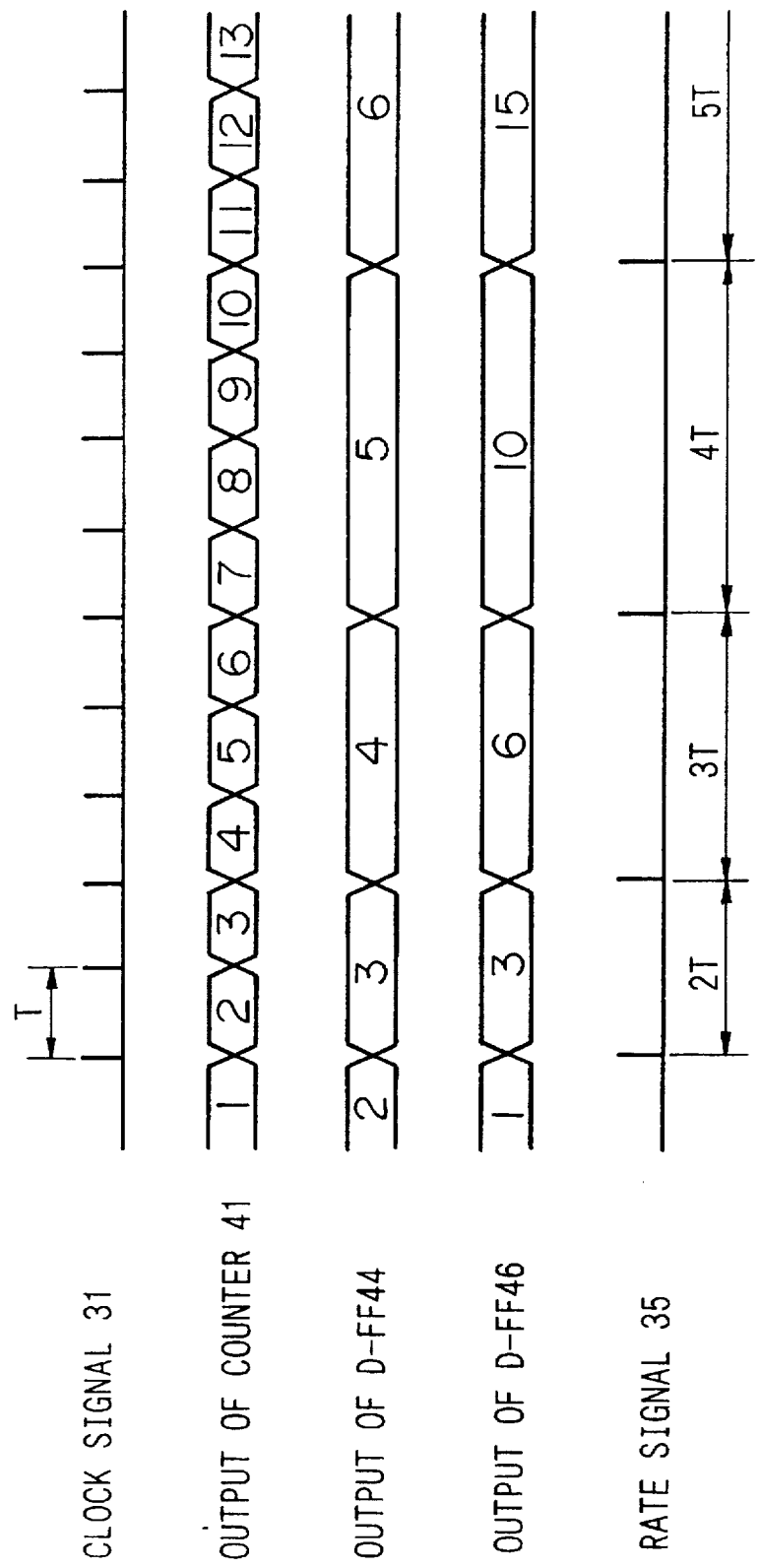
FIG. 6 is a timing chart showing an operational example of the rate generator shown in FIG. 5.

FIG. 4 is a timing chart for the rate generator according to the present embodiment shown in FIG. 3. FIG. 4 shows the case wherein N=5 in FIG. 3. In FIG. 4, A is a waveform diagram for the clock signal 31, B is a waveform diagram for the output of the counter 1, C–L are waveform diagrams for the outputs of the D-type flip-flops 6–15, M is a waveform diagram for the output of the correspondence circuit 20, N is a waveform diagram for the output of the correspondence circuit 21, O is a waveform diagram for the output of the OR gate 22, P is a waveform diagram for the rate signal 34, and Q is a waveform diagram for the output of the frequency divider.

When the clock signal 31 has a period T as shown in diagram A of FIG. 4, the counter 1 counts up as shown in diagram B of FIG. 4. With the present embodiment, the rate data 32 are given in the order "2", "3", "4", and so on. The rate data 32 are inputted to a three-stage shift register composed of the D-type flip-flops 6–8 of FIG. 3, and the output of each D-type flip-flop 6–8 is as shown in diagrams C–E of FIG. 4.

The D-type flip-flop 9 of FIG. 3 latches every other output of the D-type flip-flop 6 according to a signal (see diagram Q of FIG. 4) wherein the rate signal 34 has been divided by the frequency divider 5. As a result, the output of the D-type flip-flop 9 becomes the waveform of diagram F of FIG. 4. Likewise, the D-type flip-flop 10 of FIG. 3 latches every other output of the D-type flip-flop 7 according to the waveform of diagram Q of FIG. 4. As a result, the output of the D-type flip-flop 7 becomes the waveform of diagram G of FIG. 4. Similarly, the D-type flip-flop 11 of FIG. 3 latches every other output of the D-type flip-flop 8 according to the waveform of diagram Q of FIG. 4. As a result, the output of the D-type flip-flop 11 becomes the waveform of diagram H of FIG. 4.

The adder 16 adds the output of the D-type flip-flop 9 with the output of the D-type flip-flop 10, so that the output of the D-type flip-flop 12 changes as "3"+"2"="5", "5"+"4"="9", "7"+"6"="13", as shown in diagram I of FIG. 4. Likewise, the adder 17 adds the output of the D-type flip-flop 10 with the output of the D-type flip-flop 11, so that the output of the D-type flip-flop 13 changes as "2"+"1"="3", "4"+"3"="7", "6"+"5"="11", as shown in diagram J of FIG. 4.

The adder 18 sequentially adds the outputs of the D-type flip-flop 12, so that if the initial value for the output of the D-type flip-flop 14 is "1", then the output changes as "1"+"5"="6", "6"+"9"="15", as shown in diagram K of FIG. 4. Likewise, the adder 19 sequentially adds the outputs of the D-type flip-flop 13, so that if the initial value for the output of the D-type flip-flop 15 is "0", then the output changes as "0"+"3"="3", "3"+""="10", as shown in diagram L of FIG. 4.

Since the one of the inputs of the correspondence circuit 20 changes as "1", "6", "15", the two input signals of the correspondence circuit 20 match when the counter 1 counts up so that the counter output becomes "1", "6", and "15". Likewise, since one of the inputs of the correspondence circuit 21 changes as "3", "10", the two input signals of the correspondence circuit 21 match when the counter 1 counts up so that the counter output becomes "3", and "10". The OR gate 4 OR-processes these correspondence signals, and outputs a signal as shown in diagram O of FIG. 4. By matching input signals in each correspondence circuit, the pulse generation circuit 23 generates pulses as shown in diagram P of FIG. 4 according to the clock signal of diagram A of FIG. 4. In this way, it is possible to obtain a rate signal 34 having time intervals 2T, 3T, 4T, and so on.

While the above-described first and second embodiments presented rate generators which perform additions within the time period of two rates, the present invention is not necessarily restricted to such an arrangement, and the same technical concept is just as capable of being applied to rate generators which perform additions within the time period of three or more rates as well.

I claim:

1. A rate generator which generates rate signals of desired time intervals depending on rate data, comprising:
    counting means for counting inputted clock signals and outputting count values;
    input means for continuously inputting an arbitrary value as rate data:
    first addition means for extracting from among values input from said input means two values, and adding these two values:
    first totaling means for sequentially adding the addition results of said first addition means;
    second addition means for extracting from among values input from said input means two values delayed one step compared to values extracted by the first addition means, and adding these two values;
    second totaling means for sequentially adding the addition results of said second addition means;
    selection means for alternately selecting addition results of said first totaling means and the addition results of said second totaling means as outputs;
    correspondence detection means for receiving the output of said counting means as a first input and the output of said selection means as a second input, and detecting when the two inputs are equal; and
    pulse generation means for receiving the output of said correspondence detection means and a clock signal as inputs, and outputting a rate signal.

2. A rate generator according to claim 1, wherein said counting means is an N-bit counter, N being a natural number.

3. A rate generator according to claim 1, wherein said rate data are consecutive integers.

4. A rate generator according to claim 1, wherein said first addition means comprises:
    a shift register for shifting said rate data by a single step;
    a first flip-flop for storing said rate data prior to shifting;
    a second flip-flop for storing said rate data shifted by a single step; and
    an adder for adding a stored value of said first flip-flop with a stored value of said second flip-flop.

5. A rate generator according to claim 1, wherein said second addition means comprises:
    a shift register for shifting said rate data by one step and two steps;
    a first flip-flop for storing said rate data shifted by one step;
    a second flip-flop for storing said rate data shifted by two steps; and
    an adder for adding a stored value of said first flip-flop with a stored value of said second flip-flop.

6. A rate generator according to claim 1, wherein said first total means comprises:
    a flip-flop for storing addition results of said first addition means;
    a second flip-flop for storing addition results of said third addition means; and
    an adder for adding a stored value of said first flip-flop with a stored value of said second flip-flop, and outputting the addition result as the addition result of said third addition means.

7. A rate generator according to claim 1, wherein said second total means comprises:
    a first flip-flop for storing addition results of said second addition means;
    a second flip-flop for storing addition results of said fourth addition means; and
    an adder for adding a stored value of said first flip-flop with a stored value of said second flip-flop, and outputting the addition result as the addition result of said fourth addition means.

8. A rate generator according to claim 1, wherein said selection means performs a selection operation based on a signal wherein said rate signal has been halved in frequency.

9. A rate generator according to claim 1, wherein said pulse generation means is a D-type flip-flop which outputs the output of said correspondence means according to the timing of said clock signal.

10. A rate generator which generates rate signals of desired time intervals depending on rate data, comprising:
    counting means for counting inputted clock signals and outputting count values;
    input means for continuously inputting an arbitrary value as the rate data;
    first addition means, where M and N are natural numbers equal to or greater than two, for extracting from among values input by said input means M values input continuously, a certain value being taken as a lead value, and adding the M values;
    second addition means for extracting from among values input by said input means M values input continuously, taking the value input one step after the lead value in said first addition means as the lead value, and adding them together;
    $N^{th}$ adding means for extracting from among values input from said input means M values input continuously, taking the value input the N−1 step after the lead value in said first addition means as the lead value, and adding the M values;
    first totaling means for sequentially adding the addition results of said first addition means;
    second totaling means for sequentially adding the addition results of said second addition means;
    $N^{th}$ addition means for sequentially adding the addition results of said Nth totaling means;
    first detection means for detecting agreement between the output of said counting means and the addition results of said first totaling means;
    second detection means for detecting agreement between the output of said counting means and the addition results of said second totaling means;

$N^{th}$ detection means for detecting agreement between the output of said counting means and the addition results of said $N^{th}$ totaling means;

computing means for OR-processing outputs from the first through Nth detection means; and pulse generation means for receiving the output of said computing means and a clock signal as inputs, and outputting a rate signal.

11. A rate generator which generates rate signals of desired time intervals depending on rate data, comprising:

counting means for counting inputted clock signals and outputting count values;

input means for inputting continuously an arbitrary value as rate data;

first addition means for extracting from among values input from said input means two values, and adding these two values;

first totaling means for sequentially adding the addition results of said first addition means;

second addition means for extracting from among values input from said input means two values delayed one step compared to values extracted by the first addition means, and adding two values;

second totaling means for sequentially adding the addition results of said second addition means;

first correspondence detection means for detecting agreement between the output of said counting means and the addition results of said first totaling means;

second correspondence detection means for detecting agreement between the output of said counting means and the addition results of said second totaling means;

computing means for OR-processing the output of said first correspondence detection means and the output of said second correspondence detection means; and pulse generation means for receiving the output of said first or second correspondence detection means and a clock signal as inputs, and outputting a rate signal.

12. A rate generator according to claim 11, wherein said counting means is an N-bit counter, N being a natural number.

13. A rate generator according to claim 11, wherein said rate data are consecutive integers.

14. A rate generator according to claim 11, wherein said first addition means comprises:

a shift register for shifting said rate data by a single step;

a first flip-flop for storing said rate data prior to shifting;

a second flip-flop for storing said rate data shifted by a single step; and an adder for adding a stored value of said first flip-flop with a stored value of said second flip-flop.

15. A rate generator according to claim 11, wherein said second addition means comprises:

a shift register for shifting said rate data by one step and two steps;

a first flip-flop for storing said rate data shifted by one step;

a second flip-flop for storing said rate data shifted by two steps; and an adder for adding a stored value of said first flip-flop with a stored value of said second flip-flop.

16. A rate generator according to claim 11, wherein said second total means comprises:

a first flip-flop for storing addition results of said first addition means;

a second flip-flop for storing addition results of said third addition means; and an adder for adding a stored value of said first flip-flop with a stored value of said second flip-flop, and outputting the addition result as the addition result of said third addition means.

17. A rate generator according to claim 11, wherein said fourth total means comprises:

a first flip-flop for storing addition results of said second addition means;

a second flip-flop for storing addition results of said fourth addition means; and an adder for adding a stored value of said first flip-flop with a stored value of said second flip-flop, and outputting the addition result as the addition result of said fourth addition means.

18. A rate generator according to claim 11, wherein said computing means is an OR gate.

19. A rate generator according to claim 11, wherein said pulse generation means is a D-type flip-flop which outputs the output of said computing means according to the timing of said clock signal.

* * * * *